United States Patent [19]

Pilo

[11] Patent Number: 5,606,526

[45] Date of Patent: Feb. 25, 1997

[54] GLITCH-FREE DUAL CLOK READ CIRCUIT

[75] Inventor: Harold Pilo, Chittenden County, Vt.

[73] Assignee: International Business Machines Corporation, Armonk, N.Y.

[21] Appl. No.: 533,907

[22] Filed: Sep. 26, 1995

[51] Int. Cl.⁶ .................. G11C 7/00; G11C 8/00
[52] U.S. Cl. .................. 365/189.05; 365/230.08; 365/233
[58] Field of Search .................. 365/189.05, 230.08, 365/233

[56] References Cited

U.S. PATENT DOCUMENTS

| | | | |
|---|---|---|---|
| 3,939,333 | 2/1976 | Keech | 371/22.1 |
| 4,607,173 | 8/1986 | Knoedl, Jr. | 327/216 |
| 4,841,174 | 6/1989 | Chung et al. | 326/45 |
| 5,155,380 | 10/1992 | Hwang et al. | 327/99 |
| 5,250,852 | 10/1993 | Ovens et al. | 327/202 |

*Primary Examiner*—David C. Nelms
*Assistant Examiner*—Trong Quang Phan
*Attorney, Agent, or Firm*—Whitham, Curtis, Whitham & McGinn; Howard J. Walter, Jr.

[57] ABSTRACT

A dual clock Read circuit for a memory array having a first latch that is set in response to a data ready signal and a second latch that is set in response to a first clock signal. Logic circuitry generates a second clock signal when the first and second latches are set. A third latch is set in response to the second clock signal for latching the data from the memory array before it is forwarded to an off-chip driver.

10 Claims, 3 Drawing Sheets

GLITCH-FREE DUAL CLOK READ CIRCUIT

BACKGROUND OF THE INVENTION

1. Field of the Invention

The present invention generally relates to dual clock circuits, and, more particularly, to a glitch-free dual clock flow-thru read implementation for use in synchronous Static Random Access Memory (SRAM) devices.

2. Description of the Related Art

Clocks signals are used for timing and synchronization of the internal operations of a computer system. The frequency of the clock signal generally indicates the processing speed of the computer system; the higher the frequency the faster the execution speed.

Most computer systems provide multiple clock signals with different frequencies or phases and it is often necessary to switch among these different clock signals during execution of a program. A glitch signal will arise if the transition between the clock signals does not occur on a clock edge, whether rising or falling. This glitch signal can cause errors during execution of the program since the system components are often unable to complete their operations within the short pulse width of the glitch signal.

In an effort to ensure glitch-free operations in high performance synchronous SRAMs, some have implemented a data set-up requirement for the array data before an output register clock. In order to accomplish this task, however, Read data from the SRAM array may have to wait at an output register until an internally generated clock signal arrives to clock the Read data out to an off-chip driver (OCD). While this ensures glitch-free operations, this required delay slows down the SRAM's total access time.

In another implementation, "old" array data is allowed to propagate through an output latch temporarily, before "new" array data arrives. As a result, the user may experience output data glitches that cause system noise, false data transitions, or access time push-outs, i.e, extra delays in access time.

In light of the foregoing, there exists a need for ensuring glitch-free operations in high performance circuits using dual clocks without causing delays in the circuit operation.

SUMMARY OF THE INVENTION

The present invention is directed to a dual clock latch circuit, which substantially obviates one or more of the problems due to the limitations and disadvantages of the related art.

With this invention a data ready signal latch responds to a first clock signal and is logically combined with second latch that latches a second clock signal. The output of the combinational logic is used to reset the first and second latches and to enable an array data output latch, thus providing glitch free operation.

To achieve these and other advantages and in accordance with the purpose of the invention, as embodied and broadly described, the invention provides for a dual clock circuit for reading data from a memory array, comprising: a first latch, the first latch being set in response to a data ready signal; a second latch, the second latch being set in response to a first clock signal; logic means coupled to the first and second latches for generating a second clock signal when the first and second latches are set; and a third latch responsive to the second clock signal for latching the data from the memory array.

In another aspect, the invention is a method for reading data from a memory array, the method comprising the steps of: setting a first latch in response to a data ready signal; setting a second latch in response to a first clock signal; generating a second clock signal when the first and second latches are set; and setting a third latch in response to the second clock signal for latching the data from the memory array.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention may be utilized in high-performance synchronous Static Random Access Memories (SRAMs) requiring 5 ns/7 ns cycle/access times. SRAMs/nay have different configurations depending on the number of addressable locations as well as the width of each addressable location. For example, a 256K×1 SRAM provides 256K entries, each of which is one bit wide. It would have 18 address lines (256 k=$2^{18}$), a single data output line, and a single data input line. A 64K×4 SRAM has the same total number of bits, but will have 16 address lines to address 64K entries, each of which holds a 4-bit wide datum; therefore there are 4 data output and four data input lines.

Note, however, that the circuit and method of the present invention is not limited to 256K density SRAMs, and may be used with SRAMs of any density.

Generally to initiate a Read or Write access in a typical SRAM, the Chip Select (CS) signal must be made active at the rising edge of the main chip clock (K-Clock). For Reads, one must also activate an output enable signal that controls whether the datum selected by the address is actually driven on the pins. The SRAM Read access time is specified as the delay from the time the rising edge of the K-Clock until the time that the data is on the output lines.

For Writes, one must supply the data to be written and the address, as well as the control signal to cause the Write to occur. When both the Write Enable (WE) and CS are true, the data on the data input lines is written into the cell specified by the address. The WE signal is a pulse with a minimum set-up/hold width requirement about the K-Clock rising edge.

In the present invention, sub-7 ns access times require output transitions to be glitch-free from any possible Read combinations. In other words, when Reading "1" to "0", "0" to "1", "0" to "0", or "1" to "1", there should be a smooth transition with no intermediate data switching.

Figure 1:
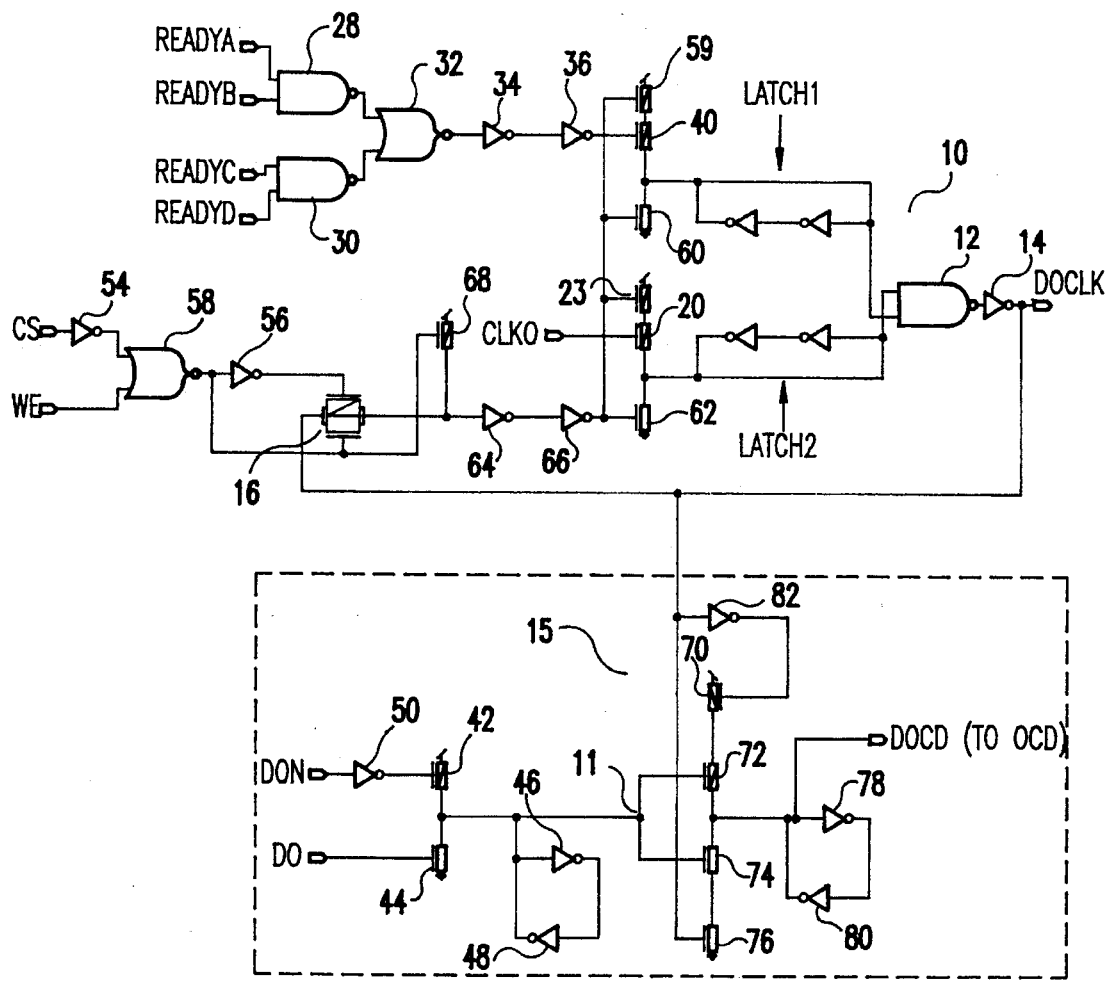
FIG. 1 is a schematic diagram of a clock generator circuit coupled to a data output latch in accordance with the present invention.

Referring now to the drawings, and more particularly to FIG. 1, there is shown a schematic diagram of a clock generator circuit 10 coupled to a data output latch 15 in accordance with the Read implementation of the present invention that ensures glitch-free operations.

For any Read cycle, two possibilities exist: (1) the data output control or C-Clock signal occurs before RAM array data has arrived; hereafter referred to as the "clock-first embodiment", or (2) the RAM array data arrives before the C-Clock signal; hereafter referred to as the "data-first" embodiment.

Figure 3:
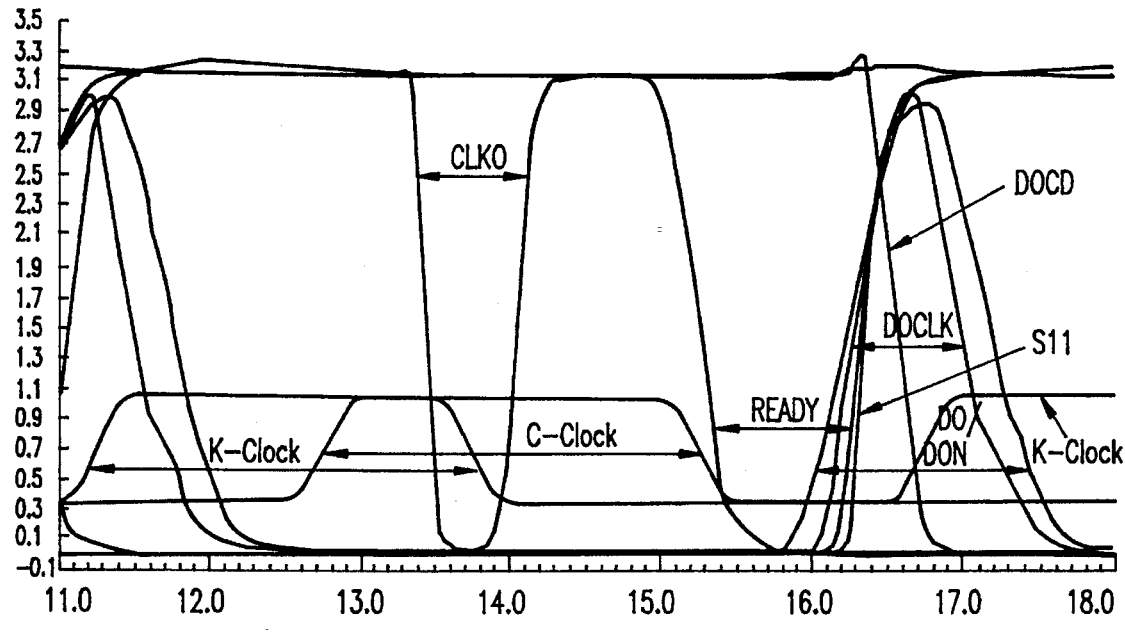
FIG. 3 is a graph illustrating the various signal waveforms associated with a "clock-first" operational embodiment of the circuit of FIG. 1.

In the clock-first embodiment, when the internal clock C-Clock occurs early in the cycle, the clock signal CLKO which, as seen in FIG. 3 is an inverted pluse corresponding to the C-Clock, generated by a simple pulse circuit (not shown) goes Low switching on PFET 20, setting LATCH2. As the RAM array data thereafter becomes available, any one of the four READY signals (READY A, READY B, READY C, and READY D; one signal for each array quadrant) will pulse Low. The READY signal is generated off a sense amplifier set signal, thereby ensuring that the READY signal will track with array data signals DO and DON across any location on the chip.

Figure 2:
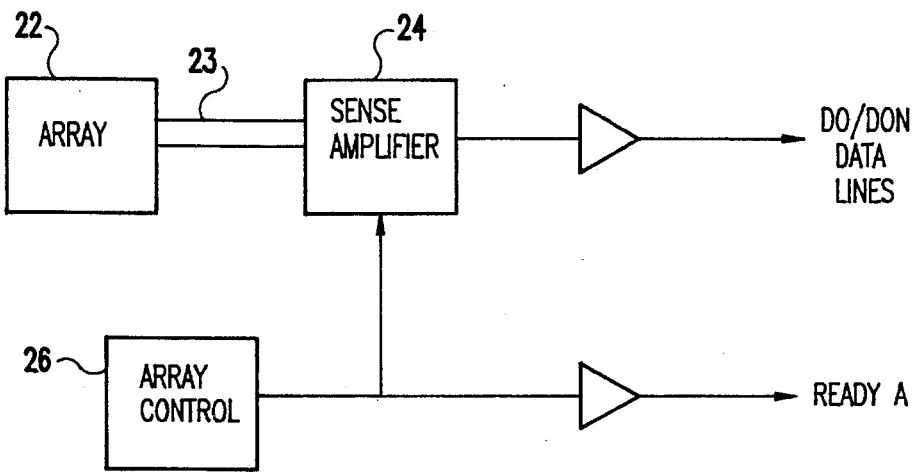
FIG. 2 is a simplified schematic of a sense amplifier circuit associated with the circuit of FIG. 1.

Referring to FIG. 2, the interaction of the sense amplifier and the READY signal is described in greater detail. As shown in FIG. 2 the array bit lines 23 carrying the data from the array 22 are fed to the sense amplifier 24. At the output of the sense amplifier 24 are the true and complement pulsed data lines DO and DON. The sense amplifier 24 is set or triggered by array controller 26, which also produces the READY A signal signifying that RAM array data is available. Thus, accurate tracking of the READY A signal and the DO/DON data lines is ensured since both have the same signal generation source. This allows for the output latch 15, discussed further below, to receive a clock that guarantees proper array data without set-up delays.

Returning to FIG. 1, when any of the READY signal pulses Low, the combinational logic, comprising NAND gates 28 and 30, NOR gate 32 and inverters 34 and 36, outputs a signal to transistor 40 and LATCH1 sets. LATCH1 and LATCH2 comprise the inputs to a logic circuit composed of an AND gate 12 and an inverter 14. When both latches are set, the active High pulse DOCLK is generated. DOCLK is the output register clock pulse. The DOCLK clock signal is used to latch the array data active High signals DO and DON into the data output latch circuit 15 by enabling the data output latch. DOCLK is timed so that it enables the data output latch before DO/DON occur, thereby resulting in array data flowing freely to the off-chip driver (OCD) (not shown) without any setup requirement.

Ideally, node 11 which is the output of a master latch (not numbered) comprising transistors 42 and 44 and inverters 46, 48, and 50, will switch within the DOCLK pulse. If node 11 switches before the DOCLK pulse, it means DOCLK is too slow, thereby increasing the access time. If node 11 switches after the DOCLK pulse, the current data may be missed and the previous data will be latched, resulting in an erroneous data latch.

After enabling the data output latch, DOCLK will reset itself through the self-resetting of latches LATCH1 and LATCH2. More specifically, generation of DOCLK causes a Low to High transition on node 23 that resets both LATCH1 and LATCH2 and therefore terminates DOCLK. The DOCLK rising edge is allowed to propagate through pass gate 52 only during a Read cycle. More particularly, pass gate 52 is controlled by CS and WE through inverters 54 and 56 and NOR gate 58. The output of pass gate 52 connectes to PFET 59 and NFETs 60 and 62 through inverters 64 and 66. PFET 68, controlled by CS and WE through NOR gate 58, pulls up the output of pass gate 52. This causes a Low to High transition at the gate of PFET 23 that enables NFETs 60 and 62 to reset. The CS and WE signals thereby ensure that before the Read cycle commences, latches LATCH1 and LATCH2 are reset.

FIG. 3 illustrates the waveforms of the clock-first situation. At the rising edge of the K-clock, all Addresses, Write Enables, Sync Selects, and Data Ins are registered internally. Output data DOCD is latched within the register 15 by a slave latch (not numbered) comprising PFETs 70 and 72, NFETs 74 and 76, and inverters 78 and 80. Differential clocks DOCLK and the inverted DOCLK output from inverter 82 are used to control the output data hold time by allowing output data DOCD to change after the rising edge of the DOCLK clock. Therefore only after a rising edge of DOCLK may new RAM data be allowed to propagate to the OCDs. As described above, if the DOCLK clock transitions before RAM data is ready, RAM data is still allowed to propagate to the OCDs as it becomes available.

Figure 4:
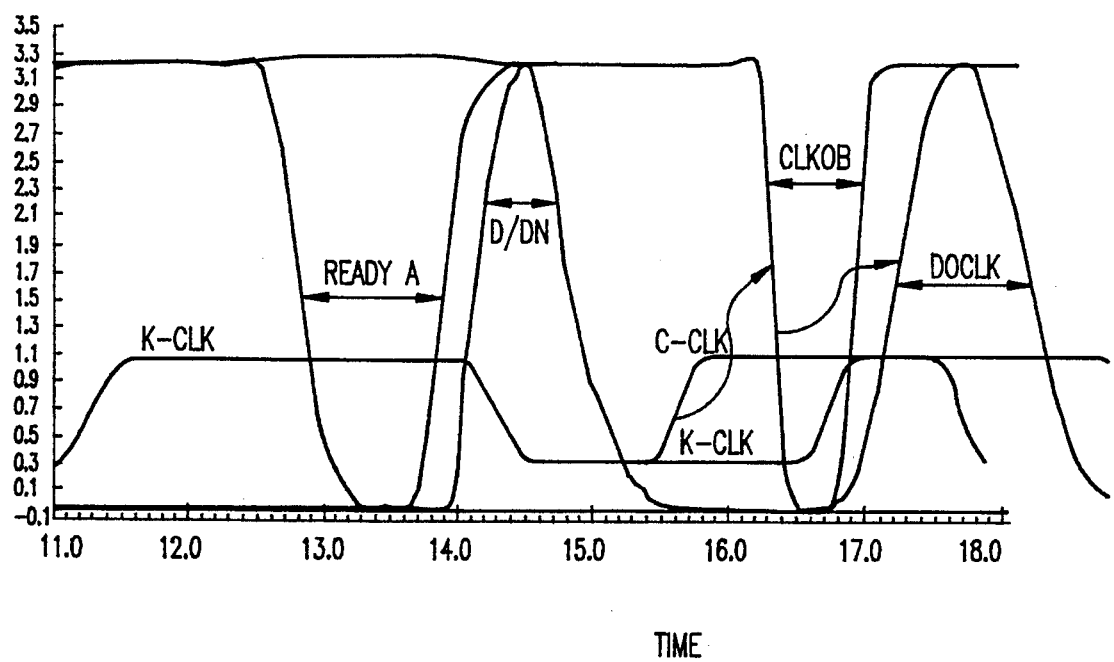
FIG. 4 is a graph illustrating the various signal waveforms associated with the "data-first" operational embodiment of the circuit of FIG. 1.

FIG. 4 illustrates the waveforms of the second embodiment, the data-first situation. When the array data arrives before the C-Clock switches, LATCH1 will be set, but it will not trigger DOCLK since LATCH2 is not set. Simultaneously, DO/DON will set node 11 to its appropriate state as determined by the input values of DO/DON. As C-Clock goes High (CLKO goes Low), LATCH2 sets and triggers DOCLK. DOCLK will enable the data output latch and allow array data to propagate to the OCD with minimum latency.

As shown in both FIGS. 3 and 4, the rising edge of the C-Clock occurs between the rising edges of the K-Clocks with the C-Clock delayed by approximately 1ns from the rising edge of the K-Clock. This prevents false triggering of the DOCLK when going from a deselect or Write cycle to a Read cycle, and vice versa, by allowing enough margin after the K-Clock rises so that the RAM has stabilized to a Read cycle.

The end result is a glitch-free, flow-thru apparatus with no data-to-clock setup delays that offers minimum access time latency with optimal data bus control. In other words, there is no waiting on a clock to transfer data. The data flows-thru to the OCD unhindered.

While the invention has been described in terms of the embodiments described above, those skilled in the art will recognize that the invention can be practiced with modification within the spirit and scope of the appended claims.

Having thus described my invention, what I claim as new and desire to secure by Letters Patent is as follows:

1. A dual clock circuit for reading data from a memory array, comprising:

a first latch, said first latch being set in response to a data ready signal;

a second latch, said second latch being set in response to a first clock signal;

logic means coupled to said first and second latches for generating a second clock signal when the first and second latches are set; and a third latch responsive to said second clock signal for latching the data from the memory array.

2. A circuit as in claim 1, further comprising means for forwarding the latched data to an off-chip driver.

3. A circuit as in claim 2, further comprising:

means for generating said data ready signal; and means for receiving array bit lines and outputting said data, said means for receiving being responsive to said means for generating said data ready signal, such that said data ready signal tracks said data.

4. A circuit as in claim 1, wherein said first clock signal and said data ready signal have the same frequency and different phases.

5. A circuit as in claim 1, wherein said logic means includes an AND gate and an inverter.

6. A circuit as in claim 3, wherein said means for receiving and outputting is a sense amplifier.

7. A circuit as in claim 3, wherein said means for generating the data ready signal is an array controller.

8. A method for reading data from a memory array, the method comprising the steps of:

setting a first latch in response to a data ready signal;

setting a second latch in response to a first clock signal;

generating a second clock signal when said first and second latches are set; and setting a third latch in response to said second clock signal for latching the data from the memory array.

9. A method as in claim 8, further comprising the step of forwarding the latched data to an off-chip driver.

10. A method as in claim 9, further comprising the steps of:

generating said data ready signal; and receiving array bit lines and outputting said data in response to said data ready signal, such that said data ready signal tracks said data.

* * * * *

UNITED STATES PATENT AND TRADEMARK OFFICE
CERTIFICATE OF CORRECTION

PATENT NO.: 5,606,526
DATED: February 25, 1997
INVENTORS: Harold Pilo

It is certified that error appears in the above-identified patent and that said Letters Patent is hereby corrected as shown below.

On the title page, item [54], and col. 1:

In the title, change "GLITCH-FREE DUAL CLOK READ CIRCUIT" to --GLITCH-FREE DUAL CLOCK READ CIRCUIT--; and On the title page, Attorney, Agent, or Firm, please correct "Whitham, Curtis, Whithan & McGinn" to --Whitham, Curtis, Whitham & McGinn--.

Signed and Sealed this

Twenty-second Day of April, 1997

Attest:

BRUCE LEHMAN

Attesting Officer

Commissioner of Patents and Trademarks